(12) United States Patent
Mayer et al.

(10) Patent No.: US 9,077,325 B2
(45) Date of Patent: Jul. 7, 2015

(54) DIGITAL SLEW RATE LIMITER

(71) Applicants: Christopher Mayer, Dover, MA (US); Hazarathaiah Malepati, South Weymouth, MA (US); Manish J. Manglani, Greensboro, NC (US)

(72) Inventors: Christopher Mayer, Dover, MA (US); Hazarathaiah Malepati, South Weymouth, MA (US); Manish J. Manglani, Greensboro, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 73 days.

(21) Appl. No.: 13/932,236

(22) Filed: Jul. 1, 2013

(65) Prior Publication Data

US 2015/0002200 A1    Jan. 1, 2015

Related U.S. Application Data

(60) Provisional application No. 61/840,988, filed on Jun. 28, 2013.

(51) Int. Cl.
*H03K 5/12* (2006.01)

(52) U.S. Cl.
CPC .................................... *H03K 5/12* (2013.01)

(58) Field of Classification Search
CPC .................................. H03K 5/04; H03K 5/12
USPC ........................................... 327/170, 171
See application file for complete search history.

(56) References Cited

U.S. PATENT DOCUMENTS 8,723,572 B1 *  5/2014  Ding et al. .................... 327/170

* cited by examiner

*Primary Examiner* — Hai L Nguyen
(74) *Attorney, Agent, or Firm* — Kenyon & Kenyon LLP

(57) ABSTRACT

A circuit may include a detector, an approximator, a look-up table, a scaler, and an integrator. The detector may generate a first difference signal and a second different signal based on an input and an output. The approximator may generate, using a one's complement operation, an index based on approximated modulus values of the first difference signal and the second difference signal. The look-up table may select one of a plurality of scaling factors based upon the index. The scaler may adjust the first difference signal and the second difference signal based on the selected scaling factor. The integrator may generate the output based on the adjusted first difference signal and the adjusted second difference signal.

21 Claims, 3 Drawing Sheets

300

DIGITAL SLEW RATE LIMITER

CROSS REFERENCE

This application claims priority to U.S. Provisional Application Ser. No. 61/840,988, filed on Jun. 28, 2013, the entire content of which is hereby incorporated by reference in this application.

BACKGROUND

In circuits such as op-amps, it may be desirable to limit the rate of change (or slew rate) in a signal to reduce or prevent distortions in the signal. To do so, the circuit may detect when a signal may be changing (increasing or decreasing) too quickly, and adjust the signal (for example, by reducing the amplitude) to limit the slew rate of the signal.

At lower clock speeds, slew rate may be easily limited, because the low clock speed signal may be detected and adjusted by a slew rate limiting circuit running at relatively higher clock speed. However, as the clock speed of the signals sought to be slew rate limited increases in new technologies, such as in high speed wireless transmitters and receivers, it may become increasingly difficult to implement higher clock speeds for slew rate limiting circuits. Complex slew rate limiting circuits may lose signal integrity and fidelity at high clock speeds.

Thus, there is a need for improved slew rate limiting circuit capable of good performance for a high speed signal with minimal loss of signal integrity.

DETAILED DESCRIPTION

Figure 1:
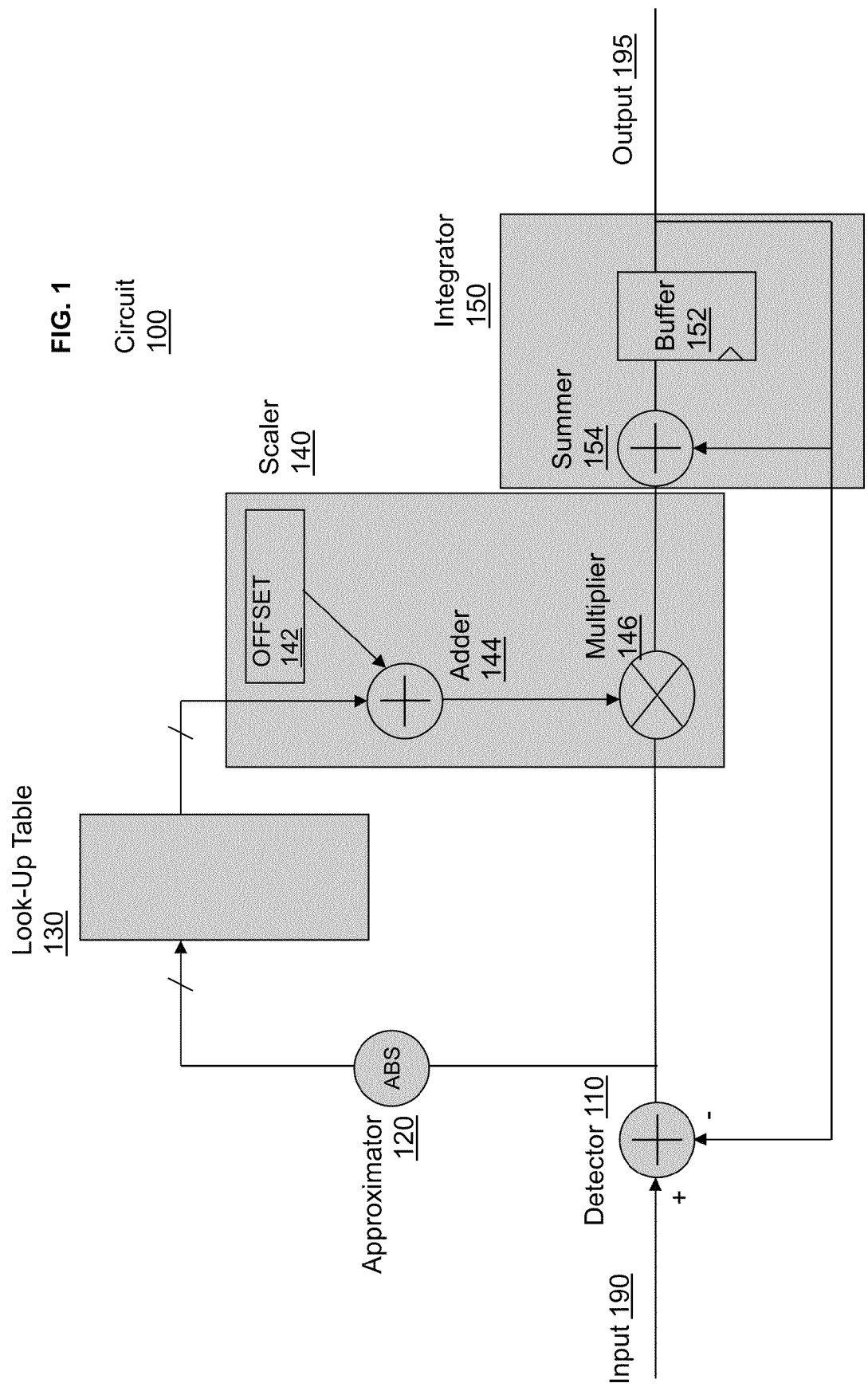
FIG. 1 illustrates a simplified block diagram of a circuit according to an embodiment of the present disclosure.

According to an embodiment, as illustrated in FIG. 1, a circuit 100 may include a detector 110, an approximator 120, a look-up table 130, a scaler 140, and an integrator 150. The detector 110 may generate a first difference signal and a second different signal based on an input 190 and an output 195. The approximator 120 may generate, using a one's complement operation, an index based on approximated modulus values of the first difference signal and the second difference signal. The look-up table 130 may select one of a plurality of scaling factors based upon the index. The scaler 140 may adjust the first difference signal and the second difference signal based on the selected scaling factor. The integrator 150 may generate the output based on the adjusted first difference signal and the adjusted second difference signal.

The detector 110 may generate a first difference signal and a second different signal based on an input 190 and an output 195. The output 195 may represent the slew rate adjusted or limited signal of the input 190. The input 190 and the output 195 each may include I and Q signal components. The first difference signal may represent the difference signal of the I signal component. The second difference signal may represent the difference signal of the Q signal component. The detector 110 may include a summation circuit for each of I and Q signal components. The detector 110 may include a digital summation circuit which generates the difference signals by subtracting the components of the output 195 from the corresponding components of the input 190.

The approximator 120 may generate, using a one's complement operation, an index based on approximated modulus values of the first difference signal and the second difference signal. The approximator 120 may receive the first difference signal and the second difference signal from the detector 110. The approximator 120 may truncate the first difference signal and the second difference signal, by for example, taking only the upper or most significant bits (MSB's) out of all of the bits (for example, the upper 6 bits of 16 bit long value) of each of the first difference signal and the second difference signal. The approximator 120 may perform a one's complement operation on each of the truncated versions of the first difference signal and the second difference signal. The one's complement operation may invert all the individual bit values of the truncated versions of the first difference signal and the second difference signal. In doing so, the approximator 120 approximates the absolute or modulus values of each of the first difference signal and the second difference signal very rapidly. The one's complement operation may be implemented simply using multiple logic inverters, and this operation may be done very quickly (less than 1 clock cycle of the circuit 100 to resolve the result), without the need to use additional buffers to calculate carry-over bits. The approximator 120 may take the approximate modulus values of the first difference signal and the second difference signal, and form an index. The index may be a digital value that include bits from both the approximate modulus values of the first difference signal and the second difference signal, for example, 6 bits from each of the approximate modulus values of the first difference signal and the second difference signal to form a 12 bit index.

The look-up table 130 may select one of a plurality of scaling factors based upon the index. The look-up table 130 may receive the index from the approximator 120, and look up and select a corresponding scaling factor among a plurality of scaling factors stored inside the look-up table 130. The plurality of scaling factors may be pre-programmed into the look-up table 130. The look-up table 130 may include or may be implemented in one of a read only memory (ROM), a random access memory (RAM), a block random access memory (BRAM), a erasable programmable read only memory (EPROM), a electrically erasable programmable read only memory (EEPROM), a Flash Memory, and a programmably logic array (PLA).

The scaler 140 may adjust the first difference signal and the second difference signal based on the selected scaling factor. The scaler 140 may receive the selected scaling factor from the look-up table 130. The scaler 140 may optionally adjust the first difference signal and the second difference signal based on an offset 142. The offset 142 may be a value stored in a memory, a buffer, or a register. For fast operation, the offset 142 may be preferably stored in a register in circuit 100. The scaler 140 may multiply, using a multiplier 146, the first difference signal and the second difference signal with the selected scaling factor. The scaler 140 may multiply, using a multiplier 146, the first difference signal and the second difference signal based on an offset 142 added to the selected scaling factor via an adder 144. Multiplier 146 may use rounding to approximate the result of multiplication quickly, for example, by rounding the input operands of multiplier 146, and/or using modified Booth's algorithm, etc. In doing so, the circuit 100 may perform slew rate limiting rapidly.

The integrator 150 may generate the output based on the adjusted first difference signal and the adjusted second difference signal. The integrator 150 may receive the adjusted first difference signal and the adjusted second difference signal from the scaler 140, and add the previous values of the components of the output 195 to the corresponding adjusted first difference signal and the adjusted second difference signal. For example, the integrator 150 may hold the previous values of the I and Q components of the output 195 in buffers 152. In a current clock period, the integrator 150 calculates the values of the output 195 for the current clock period by adding, using summer 154 the previous values of the I and Q components of the output 195 to corresponding adjusted first difference signal and the adjusted second difference signal. In doing so, the integrator 150 generates the output 195, which may be slew rate limited or adjusted. The circuit 100 may generate the output corresponding to the first difference signal and the second difference signal in less than one clock period of the circuit after the detector generating the first difference signal and the second difference signal.

Figure 2:
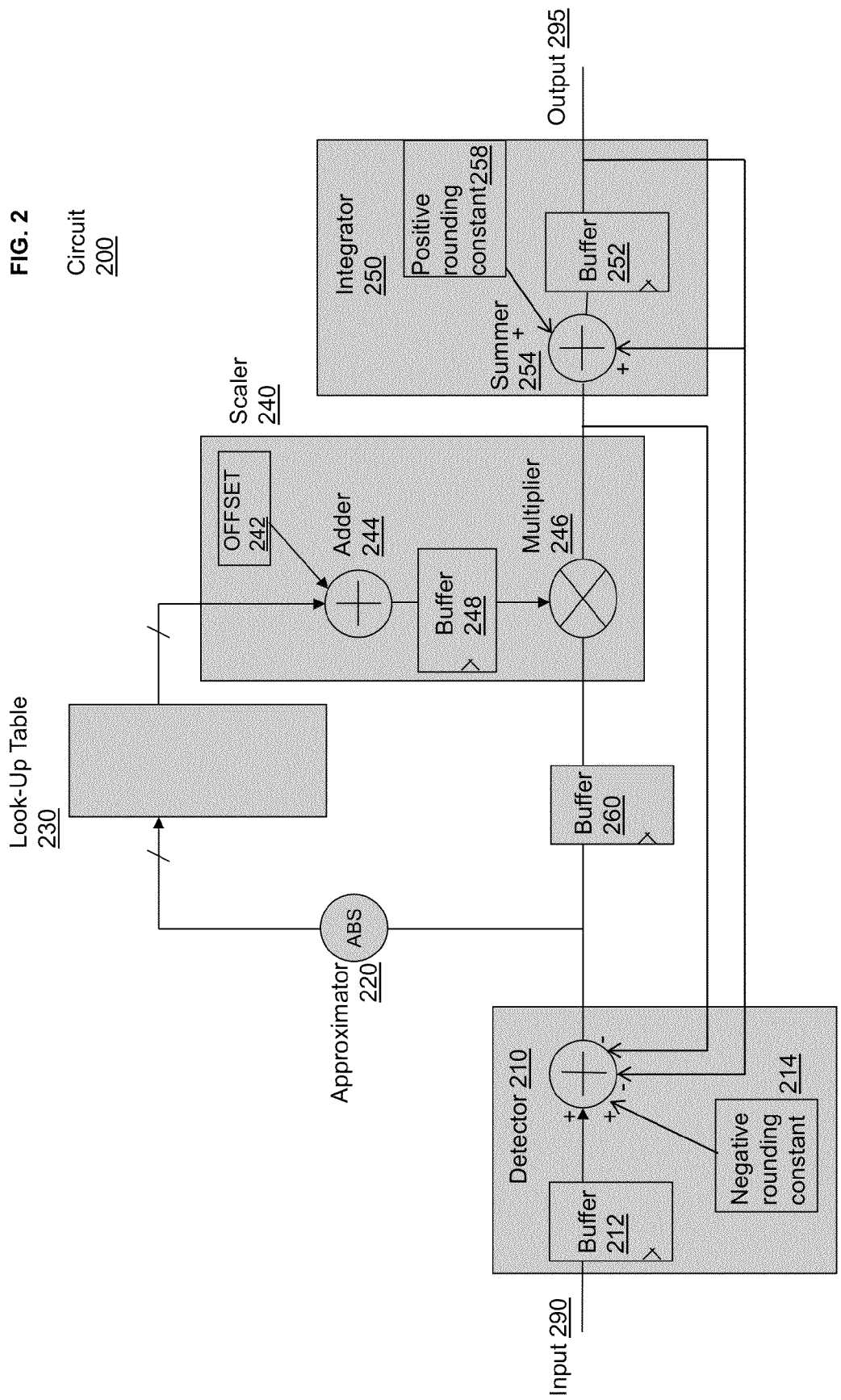
FIG. 2 illustrates a simplified block diagram of a circuit according to an embodiment of the present disclosure.

FIG. 2 illustrates an embodiment of a circuit 200 with pipelining.

As illustrated in FIG. 2, according to an embodiment, a circuit 200 may include a detector 210, an approximator 220, a look-up table 230, a scaler 240, and an integrator 250, similar to the circuit 100 in FIG. 1. The detector 210 may generate a first difference signal and a second different signal based on an input 290 and an output 295. The approximator 220 may generate, using a one's complement operation, an index based on approximated modulus values of the first difference signal and the second difference signal. The look-up table 230 may select one of a plurality of scaling factors based upon the index. The scaler 240 may adjust the first difference signal and the second difference signal based on the selected scaling factor. The integrator 250 may generate the output based on the adjusted first difference signal and the adjusted second difference signal.

Similar to the circuit 100 in FIG. 1, the circuit 200 may include offset 242, adder 244, multiplier 246, and summer 254.

According to an embodiment, the circuit 200 may further include multiple buffers 212, 248, 260, as well as the buffer 252, to form a pipelining architecture to pipeline the processing and slew rate limiting of signals. Specifically for example, buffers may be included in detector 210, scaler 240, and integrator 250, as well as between detector 210 and scaler 240, such that various signals at different branches of the circuit 200 may be synchronized to ensure correctness of data and minimize delays.

For example, multiplier 246 may generate the adjusted first difference signal and the adjusted second difference signal for a previous clock period, and buffer 252 may output the corresponding output 295 for a previous clock period. Both of these sets of signals may be fed back to detector 210 to represent the unresolved output 295 for the current clock period. The detector 210 may receive these signals and subtract them from the buffered signal of input 290 for the current clock period. This effectively eliminates the need to wait for the multiplier 246 and integrator 250 to resolve calculation of output 295 for the current clock period. That is, while the integrator 250 is resolving its calculation of the output 295 for the current clock period, the input 290 for the current clock period may be simultaneously staged through the detector 210, the approximator 220, the look-up table 230, and part of scaler 240, to have data ready for next clock period for multiplier 246 and integrator 250.

Additionally, detector 210 may include a negative rounding constant 214 to be added to each of the components of input 290. Integrator 250 may include a positive rounding constant 258 to be added to each of the components at summer 254. The detector 210 and the integrator 250 may add the respective rounding constants 214 and 258 to respective signal values, and may round the results to reduce number of bits for simplicity of calculation, further speeding up the circuit 200.

Figure 3:
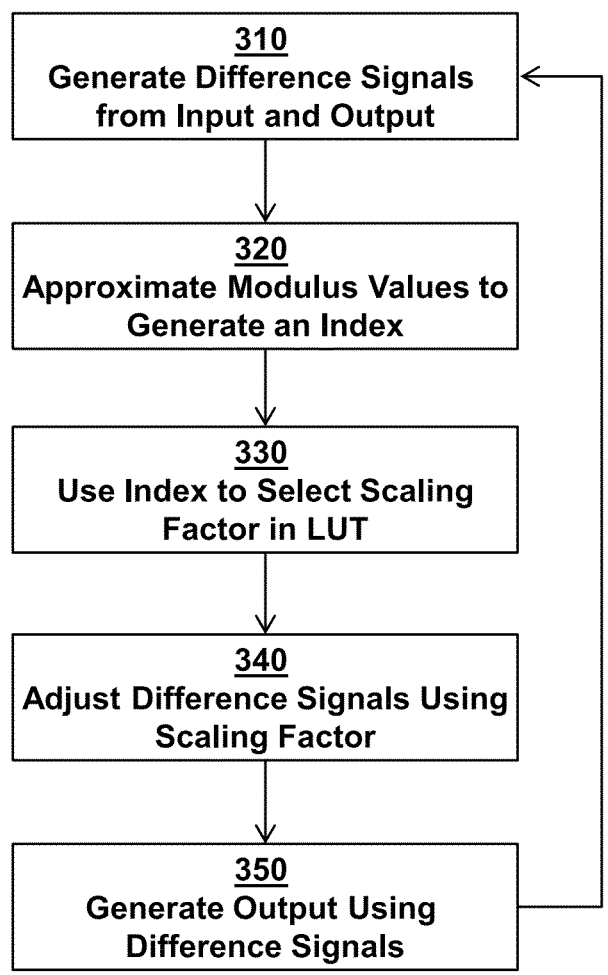
FIG. 3 illustrates a method according to features of the present disclosure.

As illustrated in FIG. 3, a method 300 may include block 310, generating, by a detector, a first difference signal and a second different signal based on an input and an output.

At block 320, generating, by an approximator using a one's complement operation, an index based on approximated modulus values of the first difference signal and the second difference signal.

At block 330, selecting, by a look-up table, one of a plurality of scaling factors based upon the index.

At block 340, adjusting, by a scaler, the first difference signal and the second difference signal based on the selected scaling factor.

At block 350, generating, by an integrator, the output based on the adjusted first difference signal and the adjusted second difference signal.

It is appreciated that the disclosure is not limited to the described embodiments, and that any number of scenarios and embodiments in which conflicting appointments exist may be resolved.

Although the disclosure has been described with reference to several exemplary embodiments, it is understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular means, materials and embodiments, the disclosure is not intended to be limited to the particulars disclosed; rather the disclosure extends to all functionally equivalent structures, methods, and uses such as are within the scope of the appended claims.

While the computer-readable medium may be described as a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the embodiments disclosed herein.

The computer-readable medium may comprise a non-transitory computer-readable medium or media and/or comprise a transitory computer-readable medium or media. In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present application describes specific embodiments which may be implemented as code segments in computer-readable media, it is to be understood that dedicated hardware implementations, such as application specific integrated circuits, programmable logic arrays and other hardware devices, can be constructed to implement one or more of the embodiments described herein. Applications that may include the various embodiments set forth herein may broadly include a variety of electronic and computer systems. Accordingly, the present application may encompass software, firmware, and hardware implementations, or combinations thereof.

The present specification describes components and functions that may be implemented in particular embodiments with reference to particular standards and protocols, the disclosure is not limited to such standards and protocols. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "disclosure" merely for convenience and without intending to voluntarily limit the scope of this application to any particular disclosure or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

We claim:

1. A circuit, comprising:
    a detector generating a first difference signal and a second difference signal based on an input and an output;
    an approximator means for generating, using a one's complement operation, an index based on approximated modulus values of the first difference signal and the second difference signal;
    a look-up table selecting one of a plurality of scaling factors based upon the index;
    a scaler adjusting the first difference signal and the second difference signal based on the selected scaling factor; and
    an integrator generating the output based on the adjusted first difference signal and the adjusted second difference signal.

2. The circuit according to claim 1, where the circuit generates the output corresponding to the first difference signal and the second difference signal in less than one clock period of the circuit after the detector generating the first difference signal and the second difference signal.

3. The circuit according to claim 1, wherein the look-up table comprises one of a ROM, a RAM, a BRAM, a EPROM, a EEPROM, a Flash Memory, and a PLA.

4. The circuit according to claim 1, wherein the scaler further adjusts the first difference signal and the second difference signal based on an offset value.

5. The circuit according to claim 1, wherein the scaler multiplies the first difference signal and the second difference signal with the selected scaling factor.

6. The circuit according to claim 1, wherein the scaler further adjusts the first difference signal and the second difference signal based on an offset value added to the selected scaling factor.

7. The circuit according to claim 1, further comprising buffers in at least one of the detector, the scaler, the integrator, and between the detector and the scaler, and the integrator adjusts the output by rounding.

8. The circuit according to claim 1, wherein the approximator means includes one or more logic gates.

9. A method, comprising:
    generating, by a detector, a first difference signal and a second difference signal based on an input and an output;
    generating, by an approximator using a one's complement operation, an index based on approximated modulus values of the first difference signal and the second difference signal;
    selecting, by a look-up table, one of a plurality of scaling factors based upon the index;
    adjusting, by a scaler, the first difference signal and the second difference signal based on the selected scaling factor; and
    generating, by an integrator, the output based on the adjusted first difference signal and the adjusted second difference signal.

10. The method according to claim 9, where the circuit generates the output corresponding to the first difference signal and the second difference signal in less than one clock period of the circuit after the detector generating the first difference signal and the second difference signal.

11. The method according to claim 9, wherein the look-up table comprises one of a ROM, a RAM, a BRAM, a EPROM, a EEPROM, a Flash Memory, and a PLA.

12. The method according to claim 9, wherein the scaler further adjusts the first difference signal and the second difference signal based on an offset value.

13. The method according to claim 9, wherein the scaler multiplies the first difference signal and the second difference signal with the selected scaling factor.

14. The method according to claim 9, wherein the scaler further adjusts the first difference signal and the second difference signal based on an offset value added to the selected scaling factor.

15. The method according to claim 9, further comprising buffers in at least one of the detector, the scaler, the integrator, and between the detector and the scaler, and the integrator adjusts the output by rounding.

16. A non-transitory computer readable medium, storing program instructions, executable by a processor to perform:
   generating, by a detector, a first difference signal and a second difference signal based on an input and an output;
   generating, by an approximator using a one's complement operation, an index based on approximated modulus values of the first difference signal and the second difference signal;
   selecting, by a look-up table, one of a plurality of scaling factors based upon the index;
   adjusting, by a scaler, the first difference signal and the second difference signal based on the selected scaling factor; and
   generating, by an integrator, the output based on the adjusted first difference signal and the adjusted second difference signal.

17. The non-transitory computer readable medium according to claim 16, where the circuit generates the output corresponding to the first difference signal and the second difference signal in less than one clock period of the circuit after the detector generating the first difference signal and the second difference signal.

18. The non-transitory computer readable medium according to claim 16, wherein the look-up table comprises one of a ROM, a RAM, a BRAM, a EPROM, a EEPROM, a Flash Memory, and a PLA.

19. The non-transitory computer readable medium according to claim 16, wherein the scaler further adjusts the first difference signal and the second difference signal based on an offset value.

20. The non-transitory computer readable medium according to claim 16, wherein the scaler multiplies the first difference signal and the second difference signal with the selected scaling factor.

21. The non-transitory computer readable medium according to claim 16, further comprising buffers in at least one of the detector, the scaler, the integrator, and between the detector and the scaler, and the integrator adjusts the output by rounding.

* * * * *